(12) United States Patent
Kim et al.

(10) Patent No.: US 8,680,741 B2
(45) Date of Patent: Mar. 25, 2014

(54) HAPTIC ACTUATOR USING CELLULOSE ELECTRO-ACTIVE PAPER FILM

(75) Inventors: Sang-Yeon Kim, Cheonan-si (KR); Jae hwan Kim, Cheonan-si (KR)

(73) Assignee: Industry Collaboration Foundation of Korea University of Technology and Education, Cheonan-si (KR)

( * ) Notice: Subject to any disclaimer, the term of this patent is extended or adjusted under 35 U.S.C. 154(b) by 366 days.

(21) Appl. No.: 13/295,520

(22) Filed: Nov. 14, 2011

(65) Prior Publication Data

US 2012/0161587 A1 Jun. 28, 2012

(30) Foreign Application Priority Data

Dec. 28, 2010 (KR) ........................ 10-2010-0137273

(51) Int. Cl.
*H01L 41/08* (2006.01)

(52) U.S. Cl.
USPC ............................ 310/311; 310/328; 310/800

(58) Field of Classification Search
USPC ......................................................... 310/800
See application file for complete search history.

(56) References Cited

U.S. PATENT DOCUMENTS

| | | | | |
|---|---|---|---|---|
| 5,897,522 A * | 4/1999 | Nitzan | ............................ | 604/20 |
| 6,442,413 B1 * | 8/2002 | Silver | ............................ | 600/345 |
| 7,769,420 B2 * | 8/2010 | Silver et al. | ................... | 600/345 |
| 8,578,937 B2 * | 11/2013 | Bhat et al. | ..................... | 128/848 |
| 8,609,426 B2 * | 12/2013 | Silver | ............................ | 436/116 |

* cited by examiner

*Primary Examiner* — Mark Gudd
(74) *Attorney, Agent, or Firm* — Jefferson IP Law, LLP

(57) ABSTRACT

A haptic actuator using a cellulose electro-active paper film is provided. The haptic actuator includes a cellulose electro-active paper film exhibiting a piezoelectric phenomenon and a metal electrode for applying electricity to the electro-active paper film, so that the haptic actuator can be provided in the form of a thin film, can manifest high transparency, and can produce displacement to the magnitude of sufficiently stimulating the sensor receptors of a user's skin in response to the applied electricity. Also, the haptic actuator is friendly to the environment and humans thanks to the use of cellulose which is an environmentally friendly material.

6 Claims, 3 Drawing Sheets

HAPTIC ACTUATOR USING CELLULOSE ELECTRO-ACTIVE PAPER FILM

PRIORITY

This application claims the benefit under 35 U.S.C. §119 (a) of a Korean patent application filed on Dec. 28, 2010 in the Korean Intellectual Property Office and assigned Serial No. 10-2010-0137273, the entire disclosure of which is hereby incorporated by reference.

BACKGROUND OF THE INVENTION

1. Field of the Invention

The present invention relates to a haptic actuator. More particularly, the present invention relates to a haptic actuator using a cellulose electro-active paper film.

2. Description of the Related Art

Haptics is a technology that enables a user to feel tactile sensations, force, motions and so on using a user input device, for example, a keyboard, a mouse, a joystick, a touch screen, etc., among the functions of a computer. Haptics is derived from the Greek adjective 'haptesthai' meaning to touch, and is also referred to as a computer tactile technology.

In conventional computer techniques, audio-visual information has been mainly used for human-computer interactions. However, a user wants virtual reality to provide more specific and graphic information, and thus, haptic techniques for transferring tactile sensations and force were developed. Haptic technology is employed in the touch screens of computers, and haptic devices and haptic rendering have also been widely applied to a variety of fields including medical simulators, aircraft and fighter simulators, vehicle simulators, and game simulators. In the near future, the haptic device is expected to be fundamentally mounted together with a monitor and speakers currently used as the output devices of the computer. Furthermore, because the potential profitability of haptics in the leisure industry is very large, research therein seems to be being conducted in depth.

However, conventional haptic devices are large and thick making it difficult to apply them to visual displays such as monitors or liquid crystal displays. Moreover, they are very opaque, and undesirably can only be embedded in visual displays instead of being applied thereon. Also, components such as polymers used for the haptic devices may undesirably cause environmental contamination.

SUMMARY OF THE INVENTION

Aspects of the present invention are to address at least the above-mentioned problems and/or disadvantages and to provide at least the advantages described below. Accordingly, an aspect of the present invention is to provide a haptic actuator using a cellulose electro-active paper film, which includes a cellulose electro-active paper film exhibiting a piezoelectric phenomenon and a metal electrode for applying electricity to the electro-active paper film, so that the haptic actuator may be provided in the form of a thin film, may manifest high transparency and may produce displacement to the magnitude of sufficiently stimulating the sensor receptors of a user's skin in response to the applied electricity.

Another aspect of the present invention is to provide a haptic actuator using a cellulose electro-active paper film, which is friendly to both the environment and humans thanks to the use of cellulose which is an environmentally friendly material.

In accordance with an aspect of the present invention, a haptic actuator using a cellulose electro-active paper film is provided. The haptic actuator includes at least one cellulose electro-active paper film which exhibits a piezoelectric phenomenon and is provided in the form of a thin film, and a metal electrode disposed on the upper surface of the electro-active paper film.

The haptic actuator may further comprise a metal membrane disposed in the form of a thin film on the lower surface of the electro-active paper film.

The metal electrode may make an angle of 40~50° to a direction of cellulose fibers of the electro-active paper film.

The electro-active paper film and the metal membrane may be bonded to each other using a paste including silver.

The metal electrode may comprise gold.

The electro-active paper film may be an electro-active paper film formed of cellulose acetate.

The at least one electro-active paper film may comprise a plurality of electro-active paper films, which are applied and attached so as to be electrically connected to each other using the paste including silver, and the metal electrode may be disposed on the uppermost surface of the plurality of electro-active paper films.

Other aspects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other aspects, features, and advantages of certain exemplary embodiments of the present invention will be more apparent from the following description taken in conjunction with the accompanying drawings, in which.

Throughout the drawings, it should be noted that like reference numbers are used to depict the same or similar elements, features, and structures.

DETAILED DESCRIPTION OF EXEMPLARY EMBODIMENTS

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions may be omitted for clarity and conciseness.

The terms and words used in the following description and claims are not limited to the bibliographical meanings, but, are merely used by the inventor to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Furthermore, throughout the description, the term "connected" means not only that one element is directly connected to another element but also that one element is indirectly connected to another element with a further element being interposed therebetween. Also, the term "comprises or includes" and/or "comprising or including" used herein shall be construed as indicating inclusion of one or more other elements rather than limitation unless stated otherwise.

Figure 1:
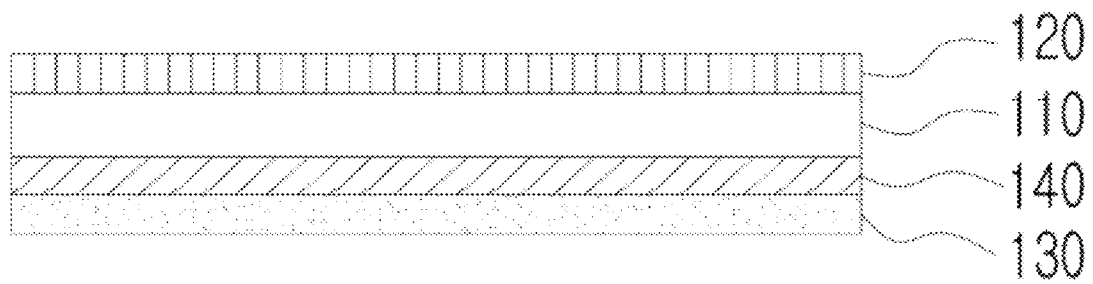
FIG. 1 is a view showing a haptic actuator using a cellulose electro-active paper film according to an exemplary embodiment of the present invention.

FIG. 1 shows a haptic actuator using a cellulose electro-active paper film according to an exemplary embodiment of the present invention.

Referring to FIG. 1, a haptic actuator 100 using a cellulose electro-active paper film 110 may include the electro-active paper film 110 and a metal electrode 120, and may further include a metal membrane 130 and a paste 140.

Specifically, the haptic actuator 100 using the cellulose electro-active paper film 110 according to the exemplary embodiment of the present invention is configured such that the cellulose electro-active paper film 110 is provided as a main material and the metal electrode 120 is formed thereon to apply electricity to the electro-active paper film 110 so as to generate displacement. Below is a detailed description of the haptic actuator 100 using the cellulose electro-active paper film 110 according to the exemplary embodiment of the present invention.

The electro-active paper film 110 may be made of cellulose in the form of a thin film exhibiting a piezoelectric phenomenon. Cellulose is known to exhibit piezoelectric effects. Hence, because cellulose causes electric polarization upon application of stress, it may be used for the electro-active paper film 110. Particularly in the haptic actuator 100 using the cellulose electro-active paper film 110 according to the exemplary embodiment of the present invention, the electro-active paper film 110 may be formed of cellulose acetate, in which cellulose acetate may manifest superior piezoelectric effects compared to pure cellulose. Cellulose, which is an environmentally friendly material, may be formed to be thin, and is inexpensive as well as friendly to both the environment and humans.

The metal electrode 120 is used to apply electricity to the electro-active paper film 110 so as to generate displacement, and is disposed on the upper surface of the electro-active paper film 110 and may be in thin metal film form. The metal electrode 120 may be an electrode of gold (Au) that functions as a heat evaporator. The metal electrode 120 may make an angle of 40~50° to the fiber direction of the electro-active paper film 110. When the metal electrode 120 is disposed at about 45° to the direction of cellulose fibers of the electro-active paper film 110, the greatest piezoelectric effects may be obtained.

The metal membrane 130 is positioned on the lower surface of the electro-active paper film 110, and may be provided in the form of a film made of metal. Particularly useful is a thin stainless steel film, with a thickness of about 8~15 μm.

The paste 140 is used to attach the electro-active paper film 110 and the metal membrane 130 so as to be electrically connected to each other, and may include silver (Ag). The Ag paste 140 may be applied on the electro-active paper film 110 using silk screening to form a flat coating layer thereon. Also a physical force may be applied so that the Ag paste 140 is applied to a predetermined thickness and the electro-active paper film 110 and the metal membrane 130 are firmly attached to each other. In addition, the Ag paste 140 may function as a kind of electrode.

Figure 2:
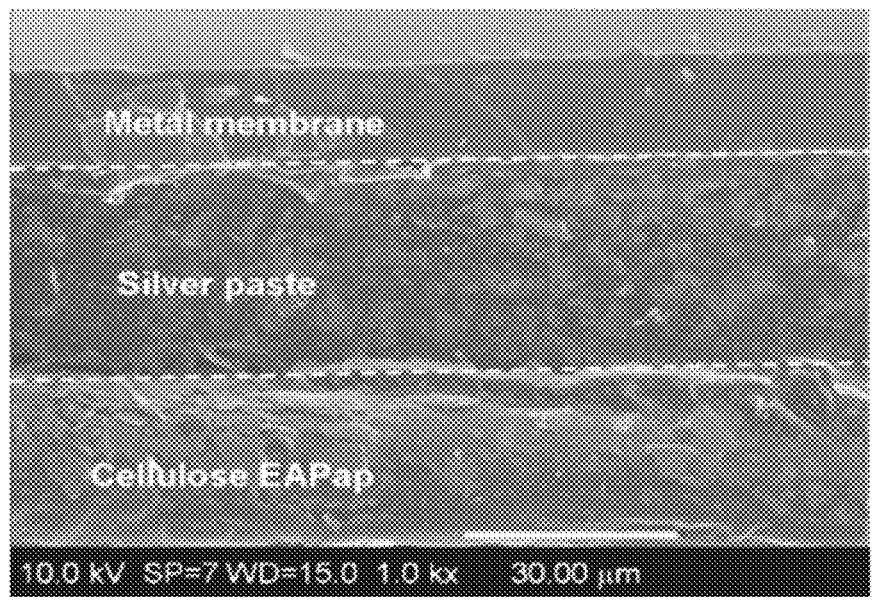
FIG. 2 is a view showing a cross-section of a haptic actuator using a cellulose electro-active paper film according to an exemplary embodiment of the present invention.

FIG. 2 shows a cross-section of a haptic actuator using a cellulose electro-active paper film according to an exemplary embodiment of the present invention.

Specifically, FIG. 2 is an electron microscope image showing the cross-section of the haptic actuator 100 using the cellulose electro-active paper film 110 according to the exemplary embodiment of the present invention, wherein the dotted lines represent the boundaries between respective layers.

Referring to FIG. 2, the haptic actuator 100 using the cellulose electro-active paper film 110 according to the exemplary embodiment of the present invention is configured such that the cellulose electro-active paper film (cellulose EAPap) 110, the Ag paste 140, and the metal membrane 130 are sequentially layered. The metal electrode 120 may be disposed on the surface of the cellulose electro-active paper film 110 opposite the surface having the Ag paste 140.

Figure 3:
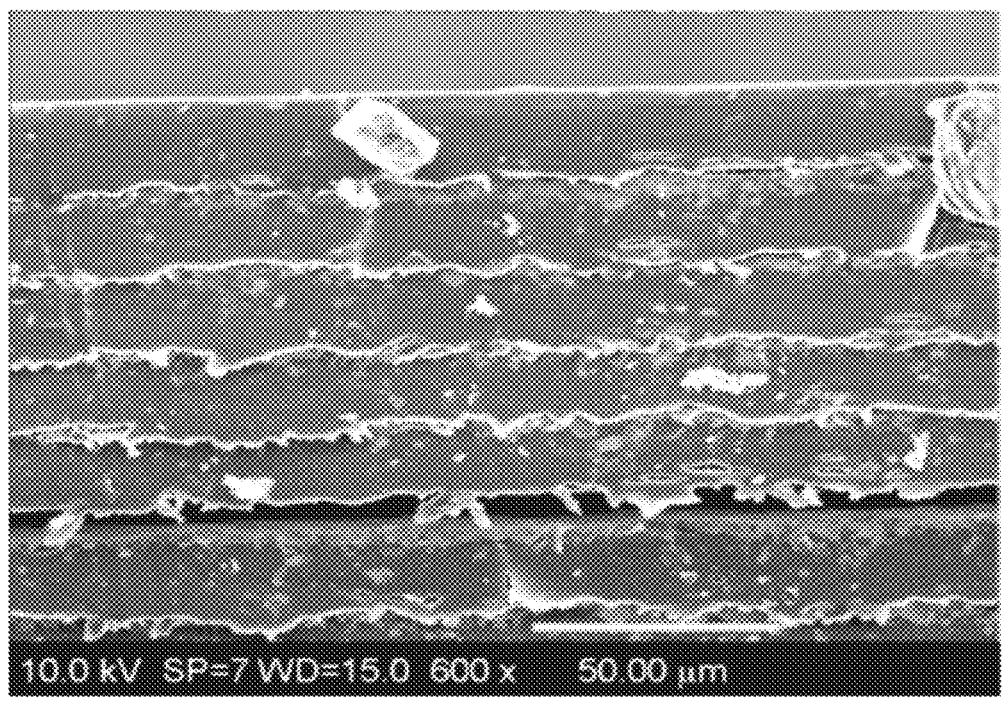
FIG. 3 is a view showing a cross-section of a haptic actuator using a cellulose electro-active paper film according to another exemplary embodiment of the present invention.

FIG. 3 shows a cross-section of a haptic actuator using a cellulose electro-active paper film according to another exemplary embodiment of the present invention.

Specifically, FIG. 3 is an electron microscope image showing the cross-section of the haptic actuator 100 using a cellulose electro-active paper film 110 according to another exemplary embodiment of the present invention, wherein the bright lines indicate the Ag paste 140, and the dark regions indicate the cellulose electro-active paper film 110.

As shown in FIG. 3, in the haptic actuator 100 according to another exemplary embodiment of the present invention, a plurality of cellulose electro-active paper films 110 may be provided, and the respective electro-active paper films 110 may be applied and attached so as to be electrically connected to each other by means of the Ag paste 140. In this case, the metal electrode 120 may be positioned on the uppermost surface of the plurality of electro-active paper films 110. When the plurality of electro-active paper films 110 is formed as in the haptic actuator 100 according to another exemplary embodiment of the present invention, the displacement of the haptic actuator 100 may be amplified by the application of electricity.

The aim of the following is to experimentally validate the effects of the haptic actuator 100 using the cellulose electro-active paper film 110 according to the exemplary embodiment of the present invention. However, the following tests are not construed to limit the scope of the haptic actuator 100 using the cellulose electro-active paper film 110 according to the exemplary embodiment of the present invention.

Figure 4:
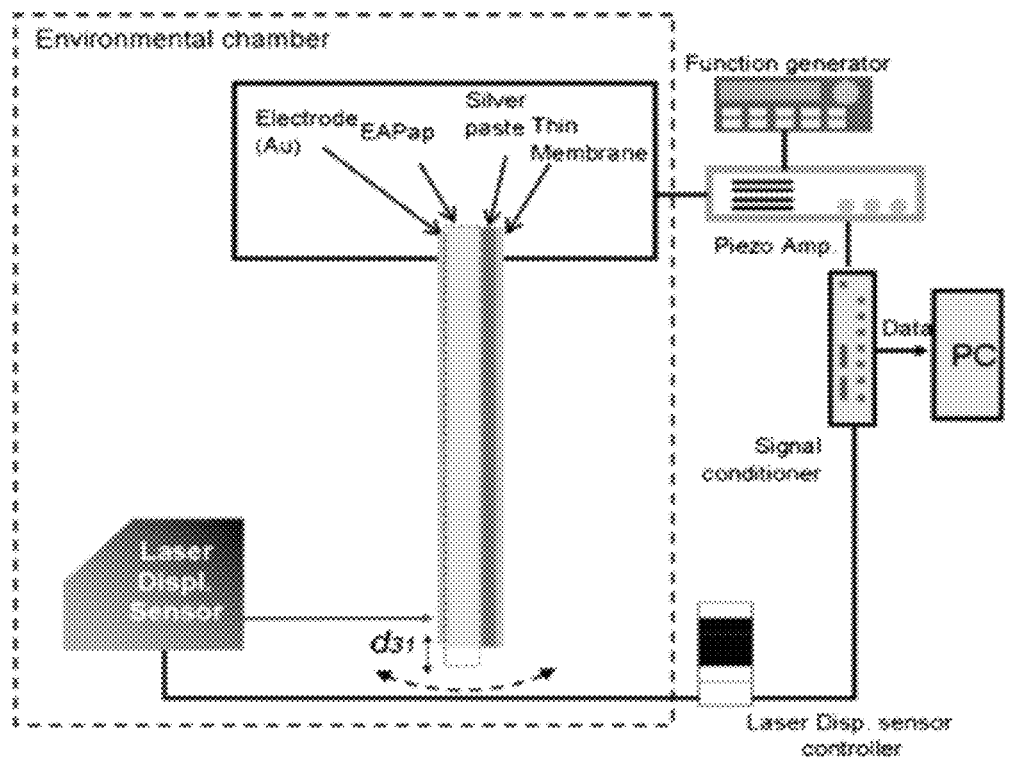
FIG. 4 is a view showing a construction of a system for testing a haptic actuator using a cellulose electro-active paper film according to an exemplary embodiment of the present invention.

FIG. 4 shows a construction of a system for testing a haptic actuator using a cellulose electro-active paper film according to an exemplary embodiment of the present invention.

Referring to FIG. 4, the system including a function generator and an amplifier was used to test the haptic actuator 100 using the cellulose electro-active paper film 110 according to the exemplary embodiment of the present invention. The displacement generated in the haptic actuator 100 may be measured using a laser displacement sensor. Using the system illustrated in FIG. 4, the displacement generated in the haptic actuator 100 of the present invention upon the application of electricity was measured. In the cellulose electro-active paper film 110 according to the exemplary embodiment of the present invention, the longitudinal direction is set to 1, the width direction is set to 2, and the thickness direction is set to 3, and d31 of FIG. 4 designates the generation of displacement in the directions of 3 and 1.

Figure 5:
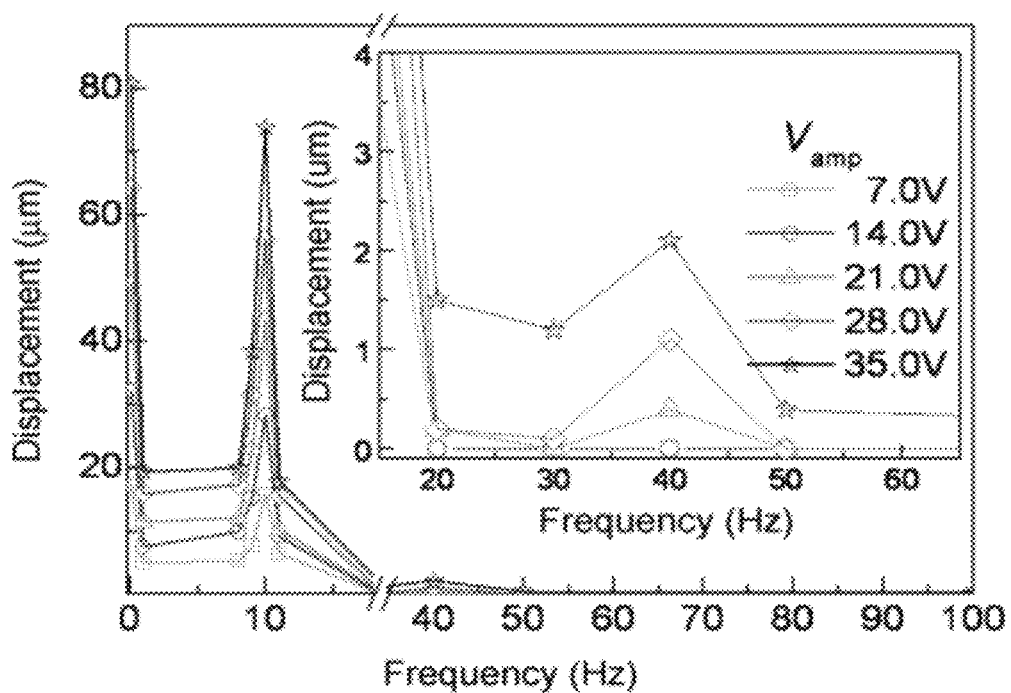
FIG. 5 is a view showing a flexural displacement of a haptic actuator using a cellulose electro-active paper film according to an exemplary embodiment of the present invention.

FIG. 5 shows a flexural displacement of a haptic actuator using a cellulose electro-active paper film according to an exemplary embodiment of the present invention.

The displacement with respect to the applied frequency in the voltage range of 7~35 V is seen in FIG. 5, part of which is additionally shown to be enlarged. The haptic actuator 100 used for this test was 60 mm long. As is apparent from FIG. 5, peaks were observed at 0.1 Hz, 10 Hz and 40 Hz, and also the maximum 75 μm displacement was shown at 35 V and 10 Hz.

Among the main sensory organs of a human's skin, the Merkel's disk may react with the force or displacement at 0.4~3 Hz, and the Meissner corpuscle may be activated at a frequency of 2~40 Hz. Referring to FIG. 5, the haptic actuator 100 using the cellulose electro-active paper film 110 according to the exemplary embodiment of the present invention is adapted to stimulate the Merkel's disk and the Meissner corpuscle under conditions of 14 V or more. Thereby, the present invention may sufficiently act as the haptic actuator, and the applicability thereof is regarded as very high.

Figure 6:
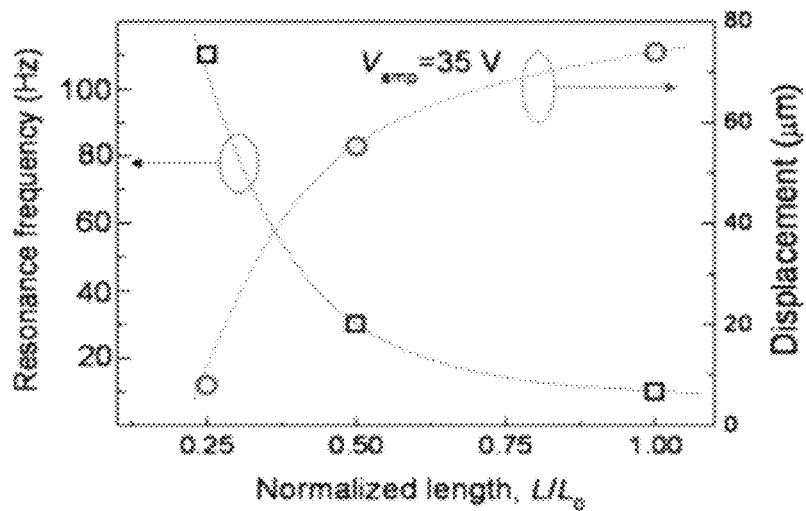
FIG. 6 is a view showing a frequency and displacement with respect to a normalized actuator length, in a haptic actuator using a cellulose electro-active paper film according to an exemplary embodiment of the present invention.

FIG. 6 shows a frequency and the displacement with respect to a normalized actuator length, in a haptic actuator using a cellulose electro-active paper film a according to an exemplary embodiment of the present invention.

Referring to FIG. 6, as the length of the haptic actuator 100 was decreased, the resonance peak was increased in the form of a secondary function, whereas the displacement was decreased non-linearly.

As described hereinbefore, the present invention provides a haptic actuator using a cellulose electro-active paper film. According to the present invention, the haptic actuator includes a cellulose electro-active paper film which exhibits a piezoelectric phenomenon and a metal electrode for applying electricity to the electro-active paper film, and thus can be provided in the form of a thin film, and manifests high transparency, and can produce displacement to the magnitude of sufficiently stimulating the sensory receptors of a user's skin in response to the applied electricity.

Also according to the present invention, because cellulose which is an environmentally friendly material is used, this haptic actuator can be friendly to both the environment and humans.

While the invention has been shown and described with reference to certain exemplary embodiments thereof, it will be understood by those skilled in the art that various changes in form and details may be made therein without departing from the spirit and scope of the invention as defined by the appended claims and their equivalents.

What is claimed is:

1. A haptic actuator using a cellulose electro-active paper film, the haptic actuator comprising:
at least one cellulose electro-active paper film which exhibits a piezoelectric phenomenon and is provided in thin film form; and
a metal electrode disposed on an upper surface of the electro-active paper film,
wherein the metal electrode makes an angle of 40~50° to a direction of cellulose fibers of the electro-active paper film.

2. The haptic actuator of claim 1, further comprising a metal membrane disposed in thin film form on a lower surface of the electro-active paper film.

3. The haptic actuator of claim 1, wherein the electro-active paper film and the metal membrane are bonded to each other using a paste including silver.

4. The haptic actuator of claim 1, wherein the metal electrode comprises gold.

5. The haptic actuator of claim 1, wherein the electro-active paper film is an electro-active paper film formed of cellulose acetate.

6. The haptic actuator of claim 1, wherein the at least one electro-active paper film comprises a plurality of electro-active paper films, which are applied and attached so as to be electrically connected to each other using the paste including silver, and
the metal electrode is disposed on an uppermost surface of the plurality of electro-active paper films.

* * * * *